United States Patent [19]
Juran et al.

[11] Patent Number: 5,164,911
[45] Date of Patent: Nov. 17, 1992

[54] SCHEMATIC CAPTURE METHOD HAVING DIFFERENT MODEL COUPLERS FOR MODEL TYPES FOR CHANGING THE DEFINITION OF THE SCHEMATIC BASED UPON MODEL TYPE SELECTION

[75] Inventors: Michael T. Juran, Highlands; David G. Von Bank, Colorado Springs, both of Colo.

[73] Assignee: Hewlett-Packard Company, Palo Alto, Calif.

[21] Appl. No.: 451,208

[22] Filed: Dec. 15, 1989

[51] Int. Cl.$^5$ ............... G06F 15/60; G06F 15/20
[52] U.S. Cl. ............ 364/578; 395/500; 395/100; 364/488; 364/917.96; 364/DIG. 2; 364/275.6
[58] Field of Search ........ 395/500, 100; 364/578, 364/488, 491

[56] References Cited

U.S. PATENT DOCUMENTS

| | | | |
|---|---|---|---|
| 3,846,763 | 11/1974 | Riikonen | 395/275 |
| 4,703,435 | 10/1987 | Darringer et al. | 364/489 |
| 4,827,427 | 5/1989 | Hyduke | 364/489 |
| 4,954,953 | 9/1990 | Bush | 364/578 |
| 5,050,091 | 9/1991 | Rubin | 364/488 |
| 5,051,938 | 9/1991 | Hyduke | 364/578 |
| 5,095,441 | 3/1992 | Hopper et al. | 364/489 |

Primary Examiner—Thomas C. Lee
Assistant Examiner—Paul Harrity

[57] ABSTRACT

Disclosed is a schematic capture and design verification system wherein the graphic symbol linked to a component is separated from the model used to simulate the component. Each component has a graphics symbol linked to a link or scion page. The link page also contains a list of all models that can be used with the component. The system allows a model to be selected for each component in a schematic, and allows the model to be changed at any time. The system also allows the models for all components to be changed with a single command. The user enters a schematic into the system, then selects a model for each component used in the schematic. After a model has been selected for each component, the user requests the system to build a netlist that describes the schematic to a simulator or other analysis or synthesis tool. In building the netlist, parameters are extracted from the link page for each component and included in the netlist to be used by the simulator. When a different simulation is desired by the user, the user instructs the system to change the model linked to the components to a new model suitable to the second simulator. The system then builds a new netlist, using parameters specific to the new model and the second simulator.

15 Claims, 7 Drawing Sheets

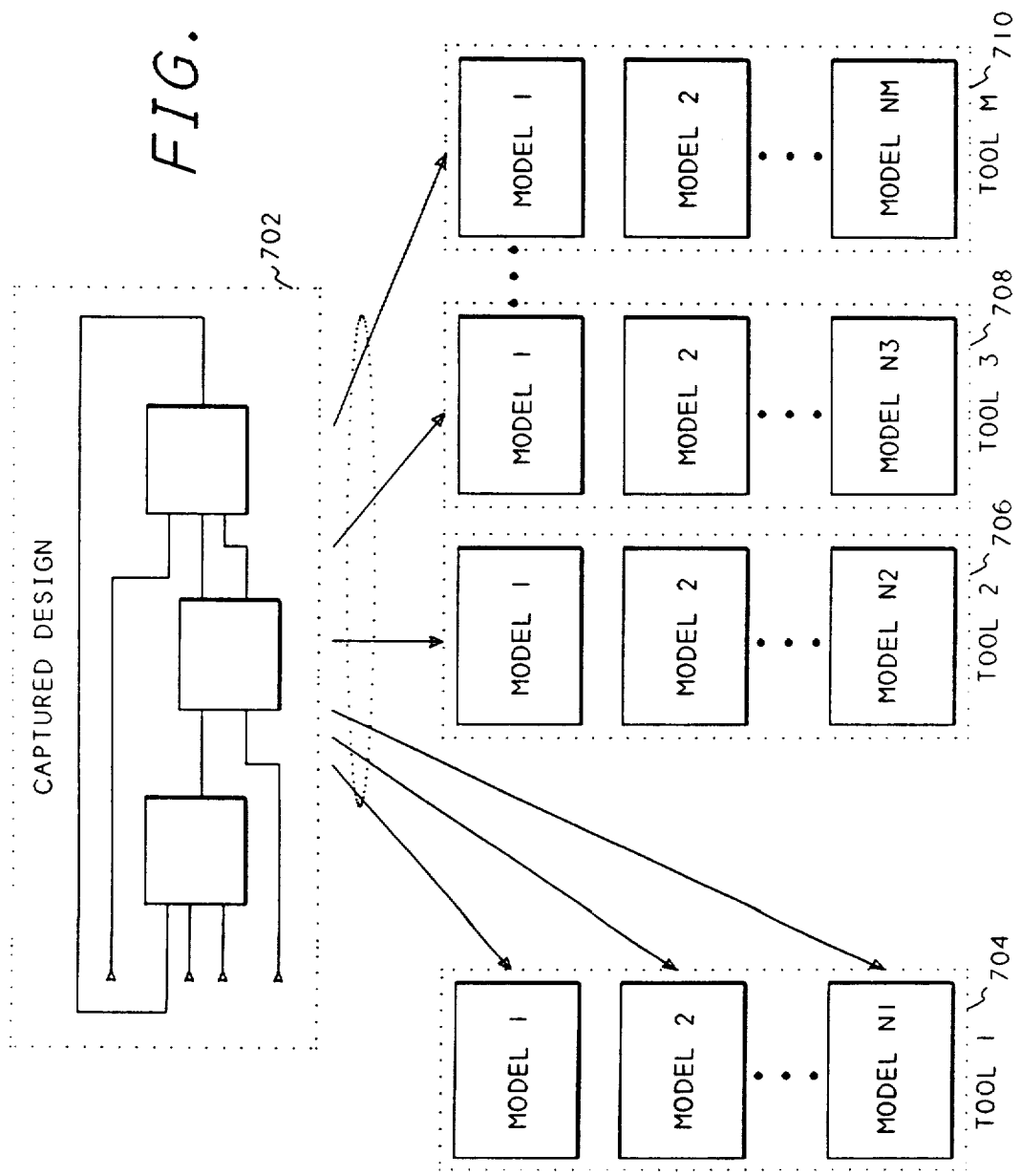

SCHEMATIC CAPTURE METHOD HAVING DIFFERENT MODEL COUPLERS FOR MODEL TYPES FOR CHANGING THE DEFINITION OF THE SCHEMATIC BASED UPON MODEL TYPE SELECTION

FIELD OF THE INVENTION

This invention relates to engineering design and more particularly to computer systems for documenting and simulating such designs. Even more particularly, the invention relates to computerized design capture systems for documenting, analyzing, and synthesizing engineering designs.

BACKGROUND OF THE INVENTION

With the availability of high-powered graphics workstations, a number of tools have been developed for the capture of engineering designs, such as electronic designs, mechanical designs, and software designs. Once captured, analysis, synthesis and evaluation may be performed on the design, for example logic simulation or printed circuit layout. Many tools exist for performing the analysis, synthesis or evaluation and many more are certain to be developed in the future.

Historically, schematic capture systems—used to document a design, and analysis tools—such as circuit simulation, were developed separately. More recently, these have been combined into a single design capture system to facilitate their use with a design. In such a system, the capture of the design is separate from the analytical tools. First the designer inputs the design into a graphics system, which displays the design for visual checking. After the design is input, it may be sent to the analytical tools for evaluation, or it may be sent to synthesis tools such as printed circuit layout. Because of the nature and size of these tools, they have been developed independently, often by different companies.

Typically a system from a single company will support documentation, simulation and printed circuit layout. Since all these tools are supplied by a single source, the graphics symbol used for documentation, and the circuit model used in simulation are linked together. A problem arises however, when a model for a particular circuit component is not available on a design capture system, or when simulation at different levels of accuracy is desired. Because of the high growth rate and availability of semiconductor components, it has been difficult for modelers to keep pace. As a result several different modeling companies and modeling technologies have emerged, and several different models often exist for a given component. Different models often are desired to simulate a circuit at different levels of accuracy, for example behavioral simulation or gate level simulation, or to perform different simulation analyses, for example logic, timing, or fault analysis.

Because the graphics symbol and model for a component are linked, each different model has a unique symbol. If a user desires to simulate a captured schematic with a different model, the user must translate the existing symbols into the new symbols, and redraw the schematic using the new symbols. Problems arise when the symbols do not readily translate. This translation takes time, because the user must delete the old symbol and insert the new symbol into the schematic.

In addition, since graphic symbols require considerable storage space, the storage of separate symbols occupies valuable disk storage space on the design capture system. Extra symbol development time is needed to develop the different symbols for different models. Often the different models will have considerable common information, however, since these models are completely separate, this information must be converted or recreated along with the symbol, with possible effects on data integrity when converting from one model to another. Integration of the models from a new vendor requires that a new graphics library be integrated, which delays and complicates the integration. Also, with the symbols and models combined, each model developer is free to create a different user interface between the symbols and the models, and often this user interface is inconsistent between different models.

There is a need in the art then for a design capture system that uses a single graphics symbol for a plurality of circuit models contained in the system. There is a further need for such a system that does not require redrawing the schematic graphics when a different model is chosen. Another need is for such a system that reduces storage space for the symbol library, and reduces symbol development time. Yet another need exists for such a system that maintains data common to a component in a common location to increase data integrity and reduce storage space. Still another need is to provide a system having a consistent user interface. A still further need is for such a system that facilitates new model integration by eliminating the requirement to integrate a new symbol.

SUMMARY OF THE INVENTION

It is an object of the present invention to provide a schematic capture system wherein an electronic component has a single graphic symbol which may be linked to any one of a plurality of circuit models.

It is another object of the present invention to provide such a system wherein changing the model linked to a circuit component does not require redrawing of the component graphic symbol or the schematic using the component.

Still another object of the invention is to provide such a system that reduces disk storage space requirements for the models.

Another object of the invention is to reduce the time necessary to develop component models by removing the requirement to develop a symbol for all models developed subsequent to the first model.

A further object of the invention is to provide a system that allows a model to be linked to the components of a schematic after the schematic has been completely entered into the system.

A further object of the system is to provide a single command that links a new model to all components on a schematic.

A still further object of the invention is to allow model-specific parameters to be entered for each model to be used, and to maintain this parameter information when switching between models.

Yet another object of the invention is to improve data integrity by retaining data common to multiple models in a single location.

Another object is to reduce the time required to install and maintain a model in the system since symbol installation and maintenance is only required for the first model.

The above and other objects are accomplished in a schematic capture and design verification system wherein the graphic symbol linked to a component is separated from the model used by a tool to process the component. Each component has a graphics symbol linked to a scion or link page. The link page also contains a plurality of couplers, one for each of the models that can be used with the component. Models having common characteristics for a family of components are grouped together as a model type.

The system allows a model type to be selected for each component in a schematic, and allows the component to be linked to a new model type at any time. The system also allows the link to a model type for all components to be changed with a single command.

The user enters a schematic into the system, then selects a model type for each component used in the schematic, which results in a specific model being selected for each component. The user may also accept a default model type for a component if desired. After a model type has been selected for all components, the user requests the system to build a netlist that describes the schematic to a simulator or other analysis or synthesis tool. In building the netlist, parameters are extracted from the coupler for each component and included in the netlist to be used by the tool.

If the user desires to use a different tool, he or she instructs the system to change the models linked to the components to new models suitable to the second tool. The system then builds a new netlist, which may be in a different format, using parameters specific to the new models and the second tool. The system also maintains the original model links for the first tool so that changing back to the first tool does not require relinking the components.

BRIEF DESCRIPTION OF THE DRAWINGS

The above and other objects, features, and advantages of the invention will be better understood by reading the following more particular description of the invention, presented in conjunction with the following drawings, wherein:

FIG. 7 shows a symbol being used for multiple models within multiple tools.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
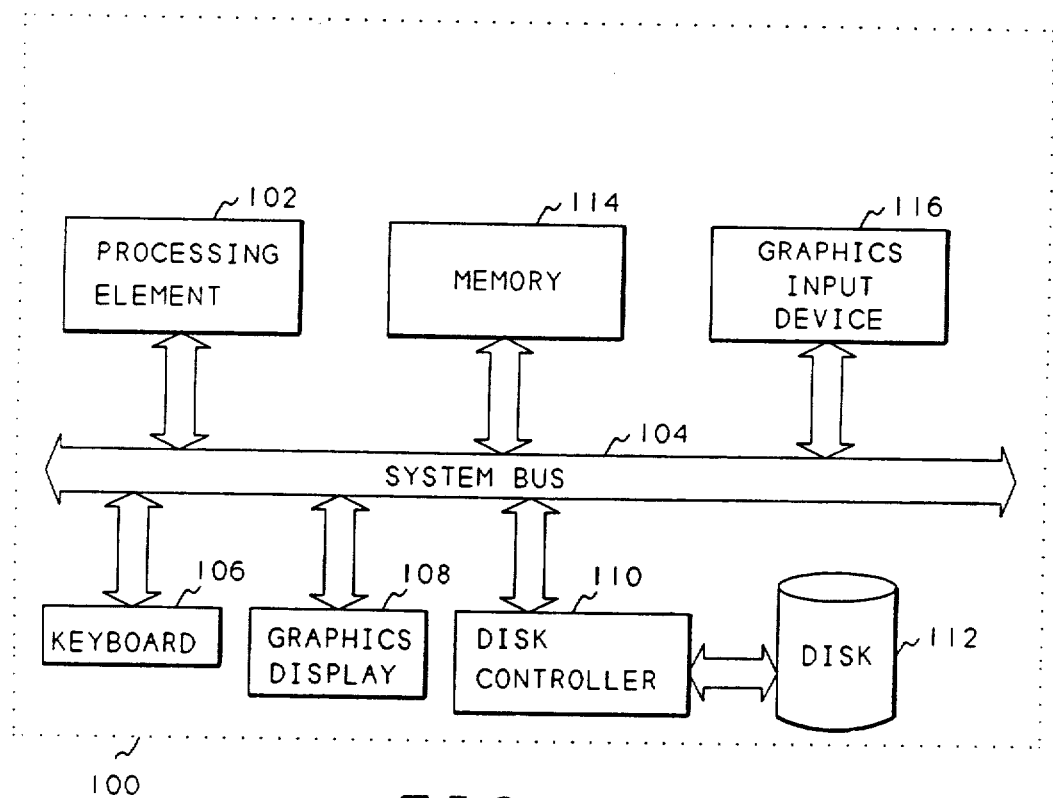
FIG. 1 shows a block diagram of a computer system incorporating the present invention.

FIG. 1 shows a block diagram of a computer system incorporating the present invention. Referring now to FIG. 1, a computer system 100 contains a processing element 102 which processes the instructions of the software of the present invention. The processing element 102 is connected to the rest of the system through a system bus 104. A keyboard 106 is used by the designer to input the schematic, and the system displays the schematic to the designer on the graphics display 108. A graphics input device 116, for example a mouse, trackball or digitizer, may also be used for input. The graphics symbols and models used with the display are stored on a disk 112 and accessed through a disk controller 110 and the system bus 104. Memory 114 is used to store the software of the design capture system when it is being executed by the processing element 102, and to store the schematic data and link pages.

Figure 2:
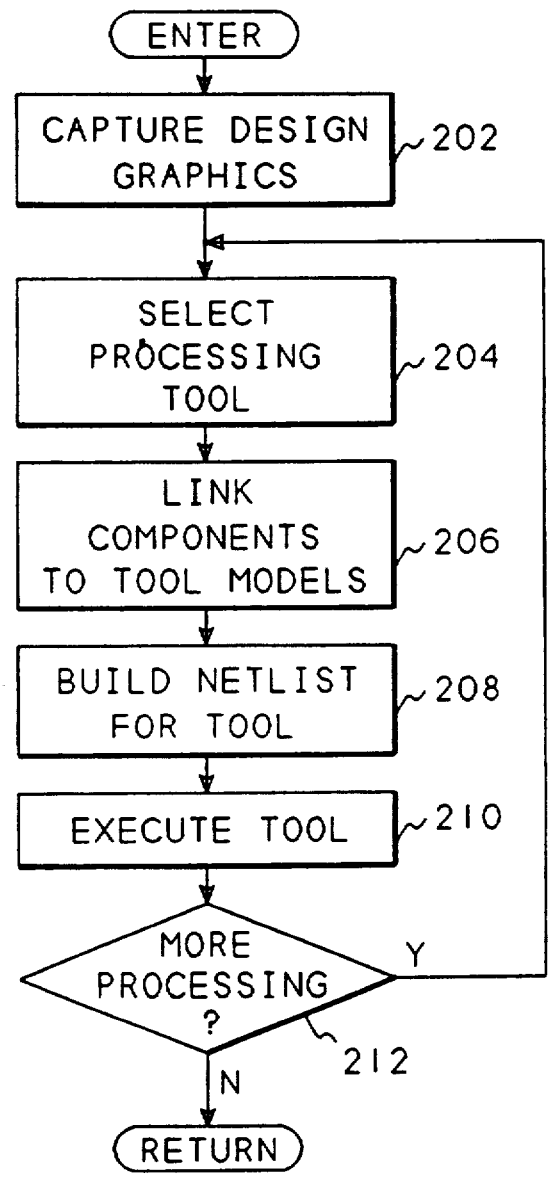
FIG. 2 is a flowchart of the process of entering and processing an electronic design.

FIG. 2 shows a flow chart of the process of entering and processing an electronic design. Referring now to FIG. 2, after entry, block 202 captures the design graphics entered by the designer. In this block the designer identifies to the design capture system the components being used in the design, and identifies the connecting wires between the various pins of those components. During and after completion of block 202, the captured design will be displayed to the designer on the graphics display 108 (FIG. 1). After the design has been captured, block 204 selects the processing tool which will process the design to perform some function for the designer. For example, a user might select a logic simulator to simulate the functions of a digital design. After the processing tool has been selected, block 206 links the components of the captured design to the models associated with the tool selected. Block 208 then combines the graphics of the captured design, and the models selected in block 206 to build a netlist that describes the components of the captured design, the wires connecting those components, and the parameters associated with those components for the selected models. Block 210 then uses the netlist built in block 208 to execute the selected tool to perform the desired function for the user. Block 212 then determines whether additional tools will be used to process the design, and if so, block 212 transfers back to block 204 to select the next tool. If no more processing is desired, block 212 exits the design capture system.

Figure 3:
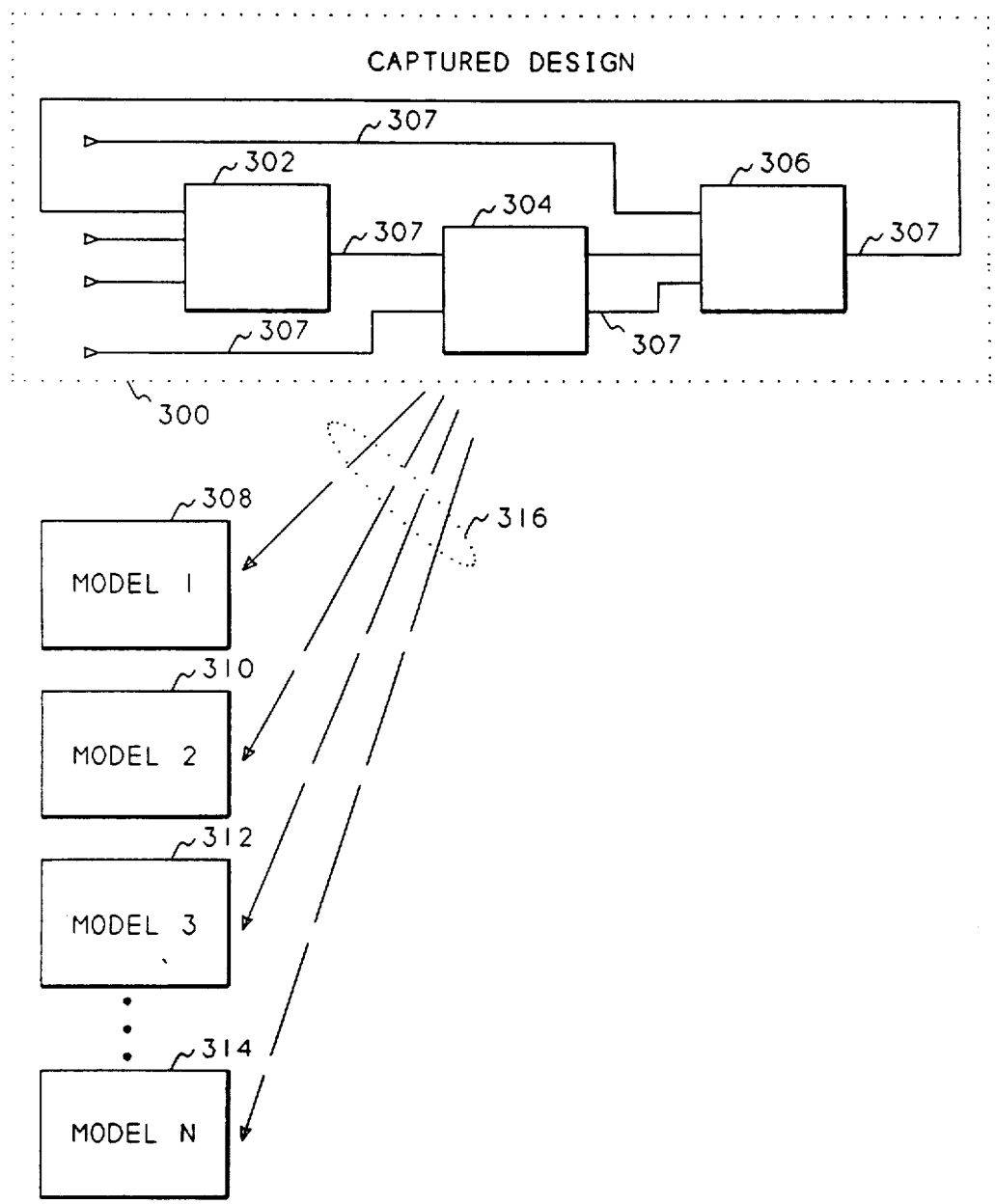
FIG. 3 is a diagram of the present invention showing a single symbol being used for multiple models.

FIG. 3 is a diagram showing that a single symbol has the ability to link to one of a plurality of models. Referring now to FIG. 3, a captured design 300 is shown, and is illustrative of a design that might be captured using the flowchart of FIG. 2. The captured design 300 has a first component 302, a second component 304, and a third component 306. These components are all connected by wires 307. Dashed lines 316 illustrate that the second component 304 has a single graphics symbol which can be linked to one of a plurality of models 308, 310, 312, or 314.

Figure 4:
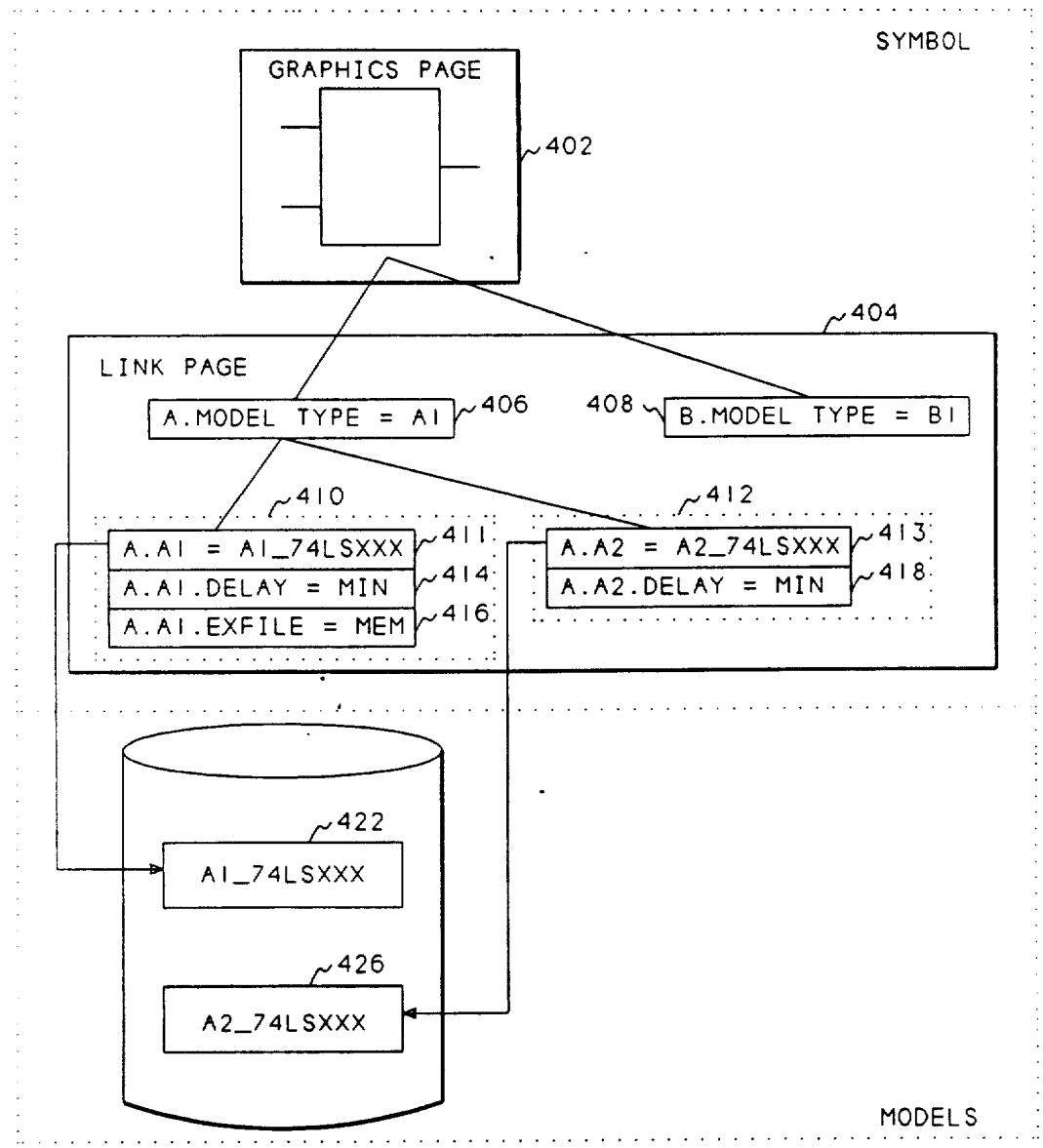
FIG. 4 is a diagram of the links between a single symbol and multiple models.

FIG. 4 is a diagram showing the linkage of a single symbol to multiple models. Referring now to FIG. 4, the present invention represents the symbol for a component of a schematic by a graphics page 402, and a scion or link page 404. The graphics page 402 contains the graphic image that will be displayed on the graphics display 108 (FIG. 1) each time the component symbol is used in a schematic. The link page 404, which is a part of the component symbol, defines all the tools and models to which this symbol can be linked. For example, the symbol shown in FIG. 4 can be linked to two tools, A 406 and B 408. The user will select tool A or tool B, depending upon the processing desired, when the tool processing is started. Continuing the example, within tool A 406, this symbol can be linked to two model types, A1 and A2. The symbol is shown currently linked to model A1_74LSXXX through the model type parameter 406, and the model coupler 410. The model type defines a family of models, each having common characteristics such as accuracy of simulation, and within a type each component has at one most model. The system allows a user to change the model type parameter for all components with a single command, thus easily changing from one set of models within a tool to a second set of model within the tool. Also, different symbols within a schematic may be linked to different model types, or they may all be linked to the same model type. In this way, for example, a microprocessor and its memory within a schematic might only be simulated at the functional level while all other components might be simulated at the gate level.

Model coupler A1 410 contains a pointer 411 to the model 422 located on the disk 112. The coupler 412 for model A2 also has a pointer 413 to its model 426, also located on the disk 112. The coupler 410 has two parameters, delay 414 and exfile 416. These parameters are used by the design capture system to build the netlist which will be passed to toll A, when tool A is started. Coupler 412 also has a delay parameter 418, which is comparable to the delay parameter 414 of the coupler 410. Together the model type and the coupler form a link between the symbol 402 and one of the plurality of models 422, 426. In another embodiment the graphics and links could be combined into a single page.

Figure 5:
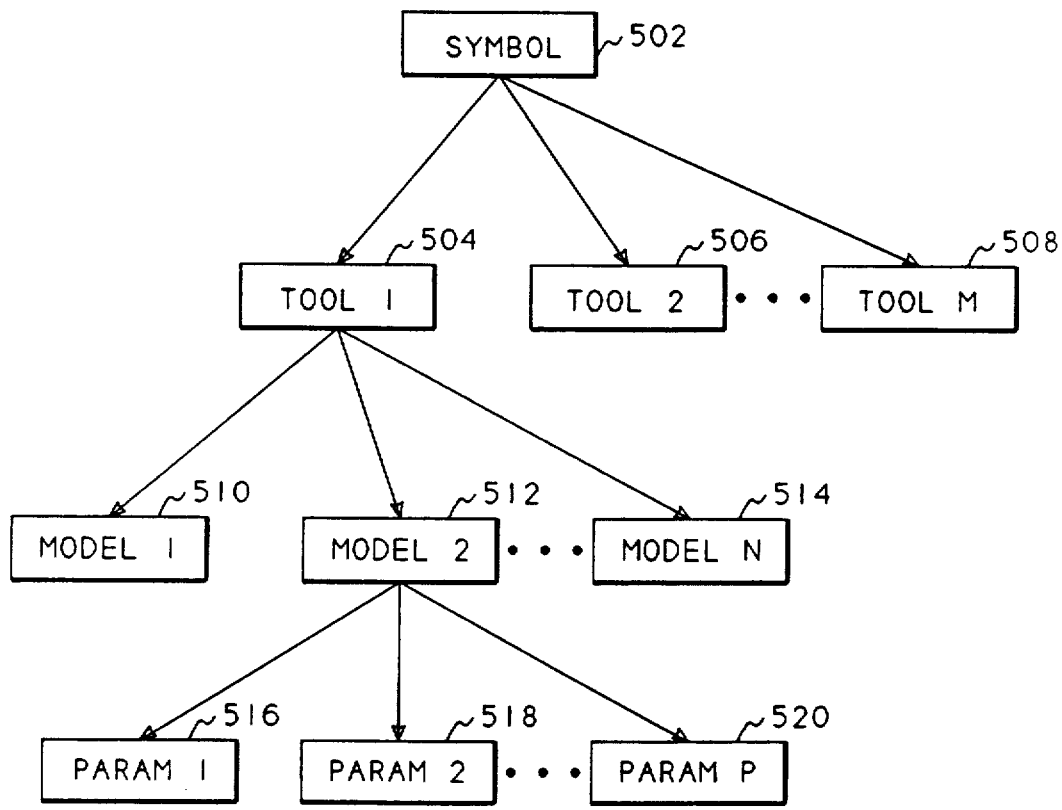
FIG. 5 shows a hierarchy diagram showing a symbol and the tools, models and parameters linked to the symbol.

FIG. 5 is a hierarchy diagram showing a symbol and the tools, models, and parameters linked to the symbol. Referring now to FIG. 5, a symbol 502 can be linked to one of a plurality of tools, illustrated by tool 1 504, tool 2 506, and tool M 508. Each of these tools can have a plurality of models, here illustrated by model 1 510, model 2 512, and model N 514, linked to tool 1 504. Each model for the symbol can have a plurality of parameters, here illustrated by param 1 516, param 2 518, and param P 520 which are sent to model 2 512. In this manner a single component symbol having a single graphic image is used with a plurality of tools and models to perform a variety of functions using the captured design. Since models are linked to tools, when the designer wishes to use a different tool to perform a different type of processing, defining the new tool to the design capture system automatically links a new set of models and parameters to the symbols of the captured schematic. Within a particular tool, the designer may link any one of a plurality of models to each symbol, as might be required for different accuracy levels of simulation in a single design. Because of this hierarchy of organization, integrating a new tool into the design capture system does not require the integration of a new symbol for each component, therefore saving considerable time when each tool is integrated. Because a single symbol is used for all the tools, considerable storage space is saved on the design capture system as well. The user also saves considerable time when changing models or tools, because using a new tool, and therefore a new set of models, does not require redrawing of the schematic on the graphics screen. This also saves considerable user time since no conversion from one graphic symbol to another is required when tools are changed. Also, because of this hierarchy, the designer is not constrained when entering the schematic into the design capture system, since the designer may select the model and tool at any time.

Figure 6:
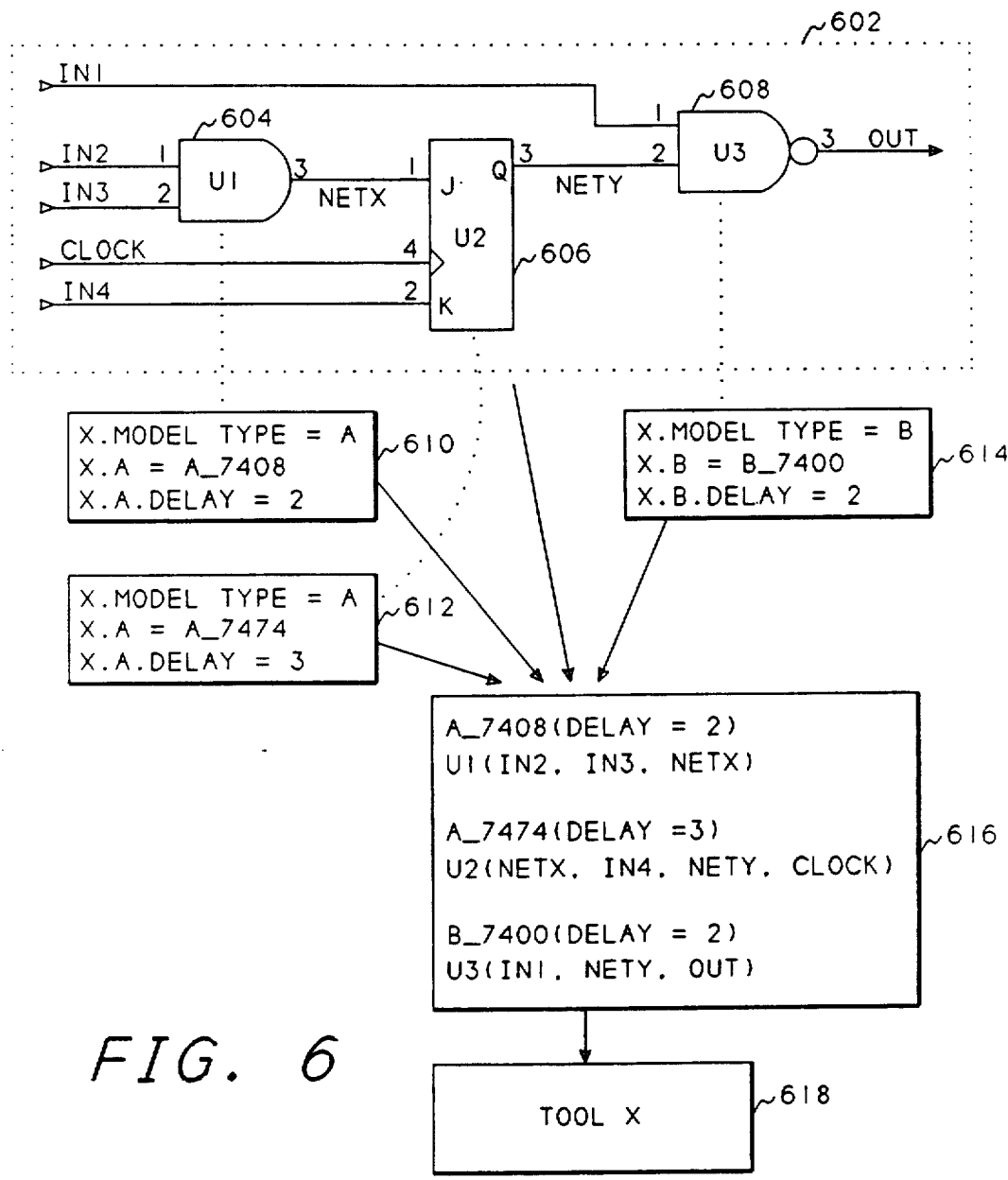
FIG. 6 shows an example of a symbol and its usage in the system.

FIG. 6 shows an example of the usage of symbols in the design capture system of the present invention. Referring now to FIG. 6, a schematic 602 having an AND gate 604, a JK flip-flop 606, and a NAND gate 608, interconnected with several inputs and a single output, is shown. AND gate 604 has a corresponding link page 610 that contains a model type parameter for model type A and model coupler for model A_7408, having a delay parameter of two, for use with tool X. Flip-flop 606 has a corresponding link page 612 with a model type parameter for model type A and model coupler for model A_7474, having a delay parameter of three, for use with tool X. NAND gate 608 has a corresponding link page 614 that has a model type parameter for model type B, and a model coupler for model B_7400, with a gate delay parameter of two, also for use with tool X.

The circuit connections of the schematic 602 and the link pages 610, 612, and 614 are combined by the design capture system to produce a netlist 616. The netlist 616 shows all the connections of the schematic 602 and includes the parameters associated with the components of the schematic found on the link pages. In the netlist 616, model A_7408, with the delay parameter of 2, is linked to the symbol U1. The pins of symbol U1 are shown in the order they are connected, that is, IN2, listed first, is connected to pin 1, IN3, second in the list, is connected to pin 2, and NETX, listed third, is connected to pin 3. Similarly, model A_7474 is linked to symbol U2, and the pin connections for U2 are described. U3 is linked to model B_7400 and its pin connections are also described.

Once the netlist 616 is built by the design capture system, it is passed to tool X 618 for further processing. Tool X could be a simulator for the logic, or a printed circuit layout tool to create a printed circuit for the schematic, or some other type of analysis or synthesis tool.

Because of the method of linking the schematic components to particular models within a particular tool, demonstrated by the above example, it is very simple to change to another tool, for example tool Y, and have the design capture system create a new netlist having a different format for this new tool. Also, the system can change the model used for all symbols by globally changing the model type parameter on all link pages. In addition the values for all parameters having the same name can be globally changed by the system.

FIG. 7 shows a symbol being used for multiple models within multiple tools. Referring now to FIG. 7, a captured design 702 can be used with any one of a plurality of tools, for example tool 1 704, tool 2 706, tool 3 708 or tool M 710, and within each of these tools each of the components of the captured design 702 can be linked to any one of a plurality of models.

The methods and apparatus described above are useful for a broad array of computerized design capture systems. They would be suitable for any design capture system that uses a single symbol which may be linked to more than one model. Examples of such systems include software design capture and mechanical design capture.

Having thus described a presently preferred embodiment of the present invention, it will now be appreciated that the objects of the invention have been fully achieved, and it will be understood by those skilled in the art that many changes in construction and circuitry and widely differing embodiments and applications of the invention will suggest themselves without departing from the spirit and scope of the present invention. The disclosures and the description herein are intended to be illustrative and are not in any sense limiting of the invention, more preferably defined in scope by the following claims.

What is claimed is:

1. In a computerized design capture system having a plurality of symbols, a computer implemented process for capturing a schematic from a user of said system and for using one of a plurality of model types for each of said symbols, said computer implemented process comprising the steps of:
   (a) capturing a schematic comprising the steps of
      (a1) accepting from the user a list of selected symbols, and
      (a2) accepting from the user a list of connections between said selected symbols;
   (b) creating a link page for each of said selected symbols and connecting each of said selected symbols to one of said link pages created for said symbol;
   (c) creating a plurality of model couplers within each of said link pages, one model coupler being created from each of said plurality of model types;
   (d) linking each of said model couplers within each of said link pages to a corresponding one of said model types;
   (e) accepting at any time from the user a single model type selection for all of said symbols; and
   (f) linking said selected symbol within each of said link pages to one of said plurality of model couplers linked to a model type identified by said model type selection accepted from the user.

2. The process of claim 1 further comprising the step of:
   (g) accepting, from the user, values for one or more parameters contained within each of said model couplers.

3. The process of claim 2 further comprising the step of:
   (h) combining said list of connections with said parameter values to produce a netlist.

4. A design capture system having a plurality of symbols and a plurality of model types for allowing a user to input and process a design, said system comprising:
   means for capturing a design from the user of said design capture system, said means for capturing comprising means for accepting a list of selected symbols, and means for accepting a list of connections between said selected symbols;
   a link page for each of said selected symbols;
   means for connecting each of said selected symbols to one of said link pages;
   a plurality of couplers contained within each of said link pages, one of sid couplers for each of said plurality of model types;
   means for linking each of said couplers to a corresponding one of said model types;
   means for accepting at any time from the user a single model type selection for all of said symbols selected; and
   means for linking each of sid selected symbols to one of said plurality of couplers linked to a model type identified by said model type selection accepted from the user.

5. The system of claim 4 further comprising means for accepting from the user one or more value for parameters contained within each of said couplers.

6. The process of claim 5 further comprising means for combining said list of connections with said parameter values to produce a netlist.

7. The system of claim 5 further comprising a single means for setting parameter values for all parameters, contained within all couplers, that have a common parameter name.

8. The system of claim 4 further comprising a single means for relinking all said selected symbols to new couplers upon accepting, by said means for accepting, from said user another single model type selection for all of said selected symbols.

9. A design capture system for allowing a user to input and process a design, said system having a plurality of symbols and a plurality of tools, each sid tool having at lest one model type, said system comprising:
   means for capturing a schematic from the suer of said design capture system, said means for capturing comprising means for accepting a list of selected symbols, and means for accepting a list of connections between said selected symbols;
   a link page for each of said selected symbols;
   means for connecting each of said selected symbols to a corresponding one of said link pages;
   a plurality of couplers contained within each of said link pages, one coupler for each of said at least one model type within each of said tools;
   means for linking each of said couplers to a corresponding one of said model types;
   means for accepting at any time a tool selection from the user;
   means for accepting at any time a single model type selection for all of said selected symbols from the user; and
   means for linking each of said selected symbols to one of said plurality of couplers linked to said model type and said tool identified by said model type selection and said tool selection accepted from the user.

10. The system of claim 9 further comprising means for accepting from the user one or more values for parameters for each of said couplers.

11. The system of claim 10 further comprising a single means for changing parameter values for all parameters, within all model couplers, that have a common parameter name.

12. The system of claim 10 further comprising means for combining said list of connections with aid parameter values to produce a netlist for use by one of said plurality of tools.

13. The system of claim 10 further comprising a single means for relining all said selected symbols to a different one of said plurality of couplers within said link pages upon accepting, by said means for accepting, from said user another single model type selection for all of said selected symbols.

14. The system of claim 13 further comprising means for retaining said parameter values in all said couplers after said relinking.

15. The system of claim 9 further comprising means for adding additional models to each of said plurality of tools.

* * * * *